United States Patent
Labus

(10) Patent No.: US 6,937,394 B2
(45) Date of Patent: Aug. 30, 2005

(54) DEVICE AND METHOD FOR CHANGING THE STRESS-INDUCED BIREFRINGENCE AND/OR THE THICKNESS OF AN OPTICAL COMPONENT

(75) Inventor: Rainer Labus, Lauchheim (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 381 days.

(21) Appl. No.: 10/117,942

(22) Filed: Apr. 8, 2002

(65) Prior Publication Data

US 2002/0149848 A1 Oct. 17, 2002

(30) Foreign Application Priority Data

Apr. 10, 2001 (DE) .......................................... 101 17 884
Feb. 16, 2002 (DE) .......................................... 102 06 478

(51) Int. Cl.$^7$ ................................................ G02B 5/30
(52) U.S. Cl. ........................ 359/499; 359/494; 359/500; 359/900
(58) Field of Search ................................ 359/499, 500, 359/847, 494, 497, 900; 356/33, 34, 35, 365

(56) References Cited

U.S. PATENT DOCUMENTS

| | | | | |
|---|---|---|---|---|
| 1,269,422 A | * | 6/1918 | Gordon ...................... 359/666 |
| 2,313,349 A | * | 3/1943 | Land .......................... 359/485 |
| 3,439,974 A | * | 4/1969 | Henry et al. ................ 359/485 |
| 3,600,611 A | | 8/1971 | Treharne | |
| 3,867,014 A | | 2/1975 | Kemp | |
| 4,155,631 A | | 5/1979 | Borsare et al. | |
| 4,226,507 A | | 10/1980 | Fuschetto | |
| 4,327,984 A | * | 5/1982 | Evans ......................... 396/544 |
| 4,418,990 A | * | 12/1983 | Gerber ......................... 351/41 |
| 4,492,431 A | | 1/1985 | Eitel et al. | |
| 4,612,810 A | * | 9/1986 | Martens ....................... 73/705 |
| 4,712,882 A | * | 12/1987 | Baba et al. ................ 359/655 |
| 4,741,609 A | * | 5/1988 | Sallis ......................... 359/847 |
| 4,993,823 A | | 2/1991 | Schaffer, Jr. et al. | |
| 5,053,794 A | | 10/1991 | Benz ............................. 354/79 |
| 5,095,515 A | * | 3/1992 | Seaver ......................... 385/16 |
| 5,457,577 A | | 10/1995 | Wilson ....................... 359/827 |
| 5,552,006 A | * | 9/1996 | Soliday et al. ............. 156/160 |
| 5,822,133 A | | 10/1998 | Mizuno et al. ............. 359/696 |
| 5,986,827 A | | 11/1999 | Hale .......................... 359/822 |
| 6,084,708 A | * | 7/2000 | Schuster ..................... 359/494 |
| 6,141,148 A | | 10/2000 | Becker | |
| 6,246,528 B1 | * | 6/2001 | Schachar .................... 359/666 |
| 6,307,688 B1 | * | 10/2001 | Merz et al. ................. 359/819 |
| 6,324,003 B1 | * | 11/2001 | Martin ....................... 359/494 |
| 6,388,823 B1 | | 5/2002 | Gaber et al. ................ 359/819 |
| 6,396,632 B1 | * | 5/2002 | Liu et al. .................... 359/579 |
| 2003/0128349 A1 | * | 7/2003 | Unno ........................... 355/67 |

FOREIGN PATENT DOCUMENTS

| | | | |
|---|---|---|---|
| DE | 196 37 563 | | 3/1998 |
| EP | 0 660 169 | | 6/1995 |
| EP | 0678 768 | | 10/1995 |
| GB | 1098897 | * | 1/1968 |
| GB | 2 138 163 | | 10/1984 |
| JP | 58-085415 A | * | 5/1983 |
| JP | 02-73215 A | * | 3/1990 |
| JP | 10039208 | | 2/1998 |
| JP | 11044834 | | 2/1999 |
| JP | 2000331927 A | * | 11/2000 ......... H01L/21/027 |
| WO | WO 96/13741 | | 5/1996 |
| WO | WO 99/67683 | | 12/1999 |

* cited by examiner

*Primary Examiner*—John Juba, Jr.
(74) *Attorney, Agent, or Firm*—Welsh & Katz, Ltd.

(57) ABSTRACT

A device serves the purpose of changing the stress-induced birefringence and/or the thickness (d and D, respectively) of an optical component by elastic deformation caused by means of stress. The optical component is gripped on a circumference, arranged at least approximately perpendicular to the optical axis, at least approximately entirely by at least one clamping element. The at least one clamping element can be actuated by at least one actuator.

In the case of a method for this purpose, compressive stress is applied to the optical component, the elastic deformation being varied via a variation in the compressive stress.

11 Claims, 1 Drawing Sheet

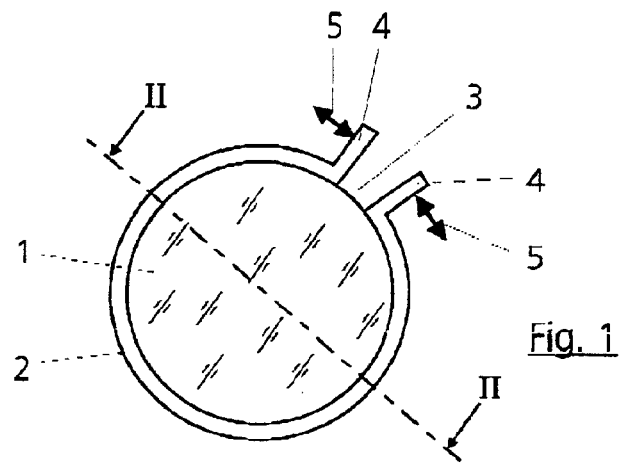
Fig. 1
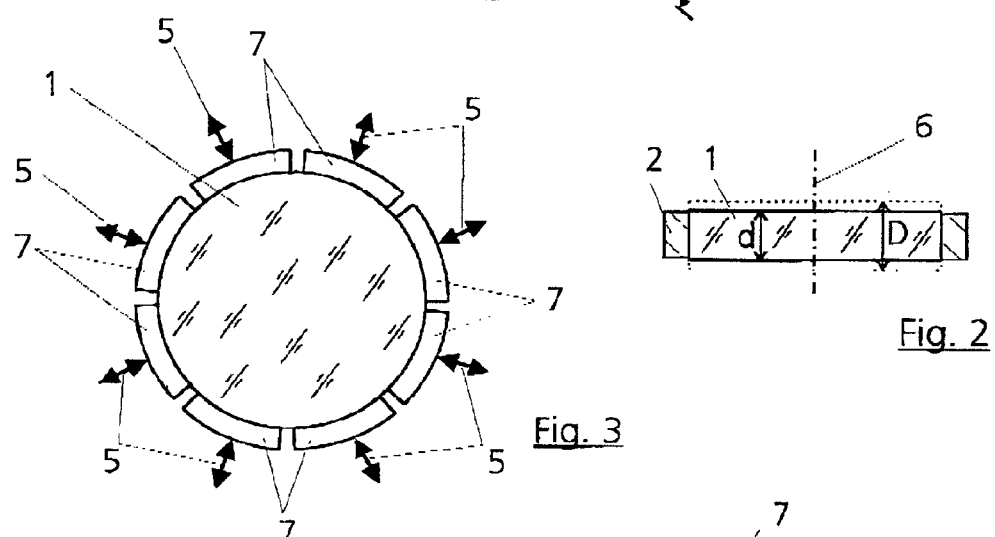
Fig. 3
Fig. 2
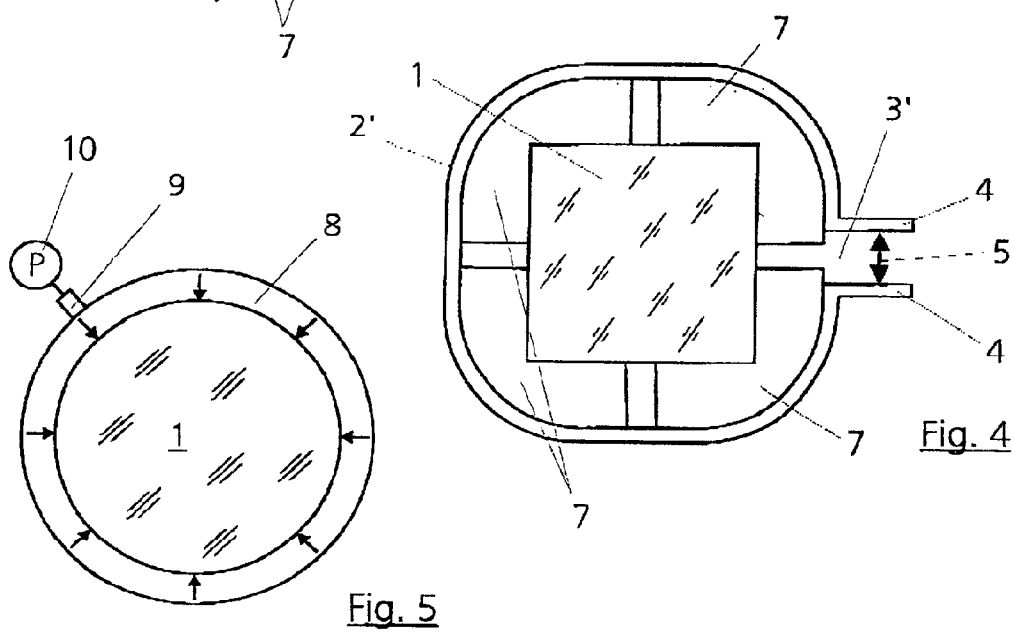
Fig. 4
Fig. 5

DEVICE AND METHOD FOR CHANGING THE STRESS-INDUCED BIREFRINGENCE AND/OR THE THICKNESS OF AN OPTICAL COMPONENT

BACKGROUND OF THE INVENTION

1. Field of the Invention

The invention relates to a device for changing the stress-induced birefringence or the thickness or the stress-induced birefringence and the thickness of an optical component by elastic deformation caused by means of stress.

The invention relates also to a method for changing the stress-induced birefringence or the thickness or the stress-induced birefringence and the thickness of an optical component by elastic deformation caused by means of stress.

2. Description of the Related Art

It is known from the general specialist literature (for example Bergmann Schäfer; Volume 3—Optik; 9th edition 1993; deGryther; Chapter 4, Point 13 "Induzierte Doppelbrechung in isotropen Stoffen" ["Induced birefringence in isotropic materials"]) that it is possible by injecting pressure or tensile stresses which respectively effect at least small plastic deformations in the material to vary correspondingly the stress-induced birefringence of electromagnetic waves, for example light, in the material.

This basic technique finds a technical application in the field of high-performance optics, for example in the production of optical elements for exposure lenses in semiconductor lithography, in DE 196 37 563 A1, which describes a DUV-capable quarter-wave plate or similar. This is designed as a plane plate under stress-induced birefringence. The plane plate consists in this case of high-quality quartz glass and is loaded under tension, free from torsion and uniformly, by suitable structures, for example lever arrangements, with a plurality of parallel tensioning devices.

In this case, however, the arrangement is comparatively complicated, since it is necessary via appropriately complex structures to ensure uniform injection of the tensile stresses into the optical element, here the plane plate.

Reference may be made to U.S. Pat. No. 6,141,148, U.S. Pat. No. 3,600,611 and U.S. Pat. No. 3,867,014 for the general prior art.

SUMMARY OF THE INVENTION

It is therefore an object of the invention to create a device for changing the stress-induced birefringence and/or the thickness of an optical component, which device is of comparatively simple design and can manage with a very low space requirement.

It is a further object of the invention to create a method for changing the stress-induced birefringence and/or the thickness of an optical component, which device is of comparatively simple design and can manage with a very low space requirement.

This object is achieved according to the invention by virtue of the fact that the optical component is gripped on a circumference, arranged at least approximately perpendicular to the optical axis, at least approximately entirely by at least one clamping element, for actuating the at least one clamping element by at least one actuator.

The optical component, which can be, for example, an end plate, a lens or, if appropriate, also a mirror, is gripped by the at least one clamping element at least approximately entirely such that there can be a very uniform injection of compressive stress into the optical component. The clamping element can be actuated via the at least one actuator, in order to raise the compressive stress applied to the optical component or, if appropriate, also to lower it.

Thus, it is possible via the clamping element to implement an initial stress applied in the normal operation of the optical component, such that a change in the stress-induced birefringence or in the thickness of the optical component or in both is possible via the actuator and a change in the injected stress both by means of raising the compressive stress and of lowering the compressive stress. Since the clamping element at least entirely grips the optical component, it is possible, as already mentioned above, to inject the stress into the optical component very uniformly. This results in a change in the stress-induced birefringence or in the thickness or in both of the optical component that is very uniform and can be varied under control.

This is the case, in particular whenever a rotationally symmetrical component such as a lens, for example, is concerned, it being possible to apply radially acting compressive stresses by means of the clamping element.

The changes in stress in the optical component will always cause minimal elastic deformations of the optical component which, in the final analysis, are also responsible in accordance with the processes known per se for a variation in the refractive index and thus in the stress-induced birefringence.

Moreover, in the case of a relatively high injection of stress, in particular in the case of a plane-parallel plate, for example a mirror or an end plate, it is possible to achieve a variation in the thickness of the optical component However, it is possible via this certainly minimal change in thickness to undertake appropriate error corrections in the field of high-performance optics, since the travel path of the light in the component can be appropriately varied, or in the case of a mirror the position of the reflective surface can be manipulated.

In a particularly favorable refinement of the invention, the at least one clamping element is designed as an open clamping ring which grips the optical component on its circumference such that the portion of the circumference not gripped by the clamping ring is smaller than 0.2 times the total circumference.

This open clamping ring surrounding the optical component creates a variant of the device according to the invention which is available, in particular, in the case of round or oval optical components that are appropriately gripped by the open clamping ring on the circumference aligned perpendicular to the optical axis. One clamping element, which can now be actuated with a single actuator, results in a very simple and robust design that, moreover, can also be executed very simply and in a space-saving fashion. In particular, the advantages with regard to the saving of overall space can be regarded as decisive advantages since, for example in the lenses in semiconductor lithography, the available overall space is frequently very tight and must therefore be utilized ideally.

One way of achieving the said object in accordance with the method is defined in that radially acting compressive stresses are applied to the optical component, the elastic deformation being varied via a variation in the compressive stress.

By virtue of the fact that use is made here of compressive stresses instead of tensile stresses for the purpose of manipulation, it is possible largely to avoid a dangerous loading of the material of the optical component to which stress is applied. Since crystalline or amorphous materials are also frequently used for the corresponding optical components because said materials should have ideal properties with regard to the workability of their surface, it is frequently necessary to make compromises with regard to resistance to tensile stress. Consequently, a corresponding application of tensile stresses to these elements can lead to corresponding problems and a not inconsiderable loading of the material results, particularly when the change in the stress-induced birefringence and/or the thickness takes place as active control with many millions of control cycles. These loads can be minimized by the injection of compressive stress or, if appropriate, also the release of a compressive stress previously applied to the optical component in the neutral position of the latter, since the above-named materials are better suited by far to absorbing compressive stresses than to compensating tensile stresses applied to them.

The loading of the material is further minimized by the very uniform injection of these compressive stresses, the result being a safe and reliable system.

Further advantageous refinements of the invention follow from the remaining subclaims and the exemplary embodiments illustrated below with the aid of the drawing.

BRIEF DESCRIPTION OF THE DRAWINGS

FIG. 1 shows a plan view of a device for changing the stress-induced birefringence and/or the thickness of an optical component;

FIG. 2 shows a schematic cross section in accordance with the line II—II in FIG. 1;

FIG. 3 shows an alternative embodiment of a device for changing the stress-induced birefringence and/or the thickness of an optical component;

FIG. 4 shows a further alternative embodiment of a device for changing the stress-induced birefringence and/or the thickness of an optical component; and FIG. 5 shows a further embodiment with a fluidic clamping element.

DETAILED DESCRIPTION

FIG. 1 shows an optical component 1 that is gripped by a clamping element 2 that is designed here as an open clamping ring 2. The clamping ring 2 has an opening 3 in its circumference such that the portion of the circumference of the optical component 1 gripped by the clamping ring 2 is smaller than 0.2 times the total circumference of the optical component 1. Fitted in the region of this opening 3 are two lugs 4 on which at least one actuator 5, indicated here by two double arrows 5, acts.

Ideally, in the case of a real structure, there is arranged in the region of the opening 3 an actuator 5 that moves the two lugs 4 of the clamping element in such a way that the size of the opening 3, and thus the portion of the circumference of the optical component 1 gripped by the clamping ring 2, can be changed by the actuator 5. All current forms of actuators 5 can be used as actuators 5 for such a design, and these would include pneumatic or hydraulic force elements, spindle/motor combinations, hot-wire elements that cause a lengthening or shortening of the wires, and thus a corresponding tensile stress, by a change in the temperature in the wires, spring strip elements that convert the transverse forces applied to them into longitudinal forces, piezoelectric actuators or the like.

The compressive stress varies in the optical component 1 by an appropriate actuation of the actuators 5, which can be performed actively, for example, such that in practice a control circuit is built up that is capable of correcting corresponding image errors or deviations via the actuators. This variation in the stress in the component 1 produces a change in the stress-induced birefringence on the basis of minimal elastic deformations that vary at least locally the refractive index of the optical component 1, inter alia.

FIG. 2 shows a cross section in accordance with the line II—II in FIG. 1. The aim here, in particular, is to examine the thickness d of the optical component 1 in the optical component 1 and the clamping ring 2. If, via an actuator 5 (not discernible in FIG. 2) and the clamping ring 2, the appropriate compressive stress is injected into the optical element 1, the result is a variation in the thickness d of the optical component 1, here in such a way that the thickness D indicated by dots arises. Thus, the above-described device additionally provides an actuator for influencing the thickness. This can be of interest, in particular, in the case of end plates, $\lambda/4$ plates or the like, since here the travel path of the light in the material affected by a corresponding refractive index is variable. In principle, it would also be possible, of course, to influence the dimensions of the optical component 1 such that it would also be conceivable and sensible to use it in lenses or other components 1 that are not plane-parallel.

A further alternative here would also be the use in the case of optical components 1 aluminized on one side, since it is also possible via the variation in the thickness d or D to achieve a variation in the position of the surface of the optical component 1 in an axial fashion relative to its optical axis 6.

FIG. 3 shows an alternative embodiment of the device for changing the stress-induced birefringence and/or the thickness d or D of the optical component 1. In this case, a plurality of clamping elements 7 are provided that are designed here in the manner of a plurality of clamping jaws. The clamping elements 7 likewise in this case surround the circumference of the optical component 1 at least approximately entirely such that it is also possible here to perform a very uniform injection of the desired compressive stress into the optical component 1. In the exemplary embodiment illustrated in FIG. 3, each of the clamping elements 7 has a dedicated actuator 5 that is also indicated here once again by a double arrow. While driving these actuators 5 appropriately, it is also possible here to achieve a suitable uniform injection of the compressive stress into the optical component 1.

Of course, it is also conceivable in principle that in each case a plurality, or if appropriate even all, of the clamping elements 7 are driven via an actuator 5. A possibility for this would then be an appropriate gear element, a lever gear or the like, which uniformly passes on the introduction of the compressive stress.

It would also be possible here in principle for the clamping elements 7 to be surrounded by a hot wire, for example, that could then be constructed as a closed ring around the clamping elements 7 and can be used through a variation in its temperature to input the required stresses.

FIG. 4 shows a further alternative embodiment of the device for changing the stress-induced birefringence and/or the thickness d or D of the optical component 1.

In addition to the clamping elements 7 known from FIG. 3, which are arranged here in a somewhat changed way because of the altered shape of the optical component 1, use is additionally made here of a clamping ring 2' that functions in principle similarly to the clamping ring 2 described in FIG. 1 and likewise has at least one actuator 5, for example in the region of the opening 3' of the clamping ring 2'. Here, however, the clamping ring 21 is in principle the gear element that uniformly transmits the stress applied by the actuator 5 to the individual clamping elements 7, and thus also ensures comparatively uniform input of the stress into the form of the optical component 1, which is comparatively unsuitable for this.

A further alternative embodiment is illustrated in FIG. 5, a radial compressive stress being produced via an annular pressure chamber around the optical component 1, specifically a lens, as clamping element 8. The pressure chamber 8 is provided with a connection 9 to a pressure source 10. The pressure source 10 exerts compressive forces, arranged distributed appropriately uniformly over the circumference, in the form of a surface pressure on the optical element. In this case, the compressive stress can also be actively controlled in a simple way.

Both a hydraulic and a pneumatic pressure source can be used as pressure source 10.

What is claimed is:

1. A method for uniformly changing the thickness of a rotationally symmetrical birefringent optical component by continuous inward radial compressive forces, comprising the step of applying uniform radially acting compressive clamping forces about substantially an entire circumference in a uniform continuous manner to the birefringent optical component by an annular pressure chamber which encloses the birefringent optical component on the outside, and varying the inward radial compressive forces.

2. The method as claimed in claim 1, including producing pressure in the annular pressure chamber in by a pneumatic or hydraulic pressure source.

3. The method as claimed in claim 1, including actively controlling the variation in the compressive clamping force.

4. A method for changing the stress-induced birefringence and the thickness of a rotationally symmetrical birefringent optical component by elastic deformation caused by means of stress, including the steps of applying radially acting compressive stresses to the birefringent optical component, and varying the elastic deformation by varying the compressive stress.

5. The method as claimed in claim 4, wherein said radially acting compressive stresses are produced by an annular pressure chamber which encloses the birefringent optical component on the outside.

6. The method as claimed in claim 5, wherein a pneumatic or hydraulic pressure source is used to produce pressure in the annular pressure chamber.

7. The method as claimed in claim 4, wherein the step of varying the compressive stress is actively controlled.

8. An assembly for changing the thickness of a birefringent optical component comprising a birefringent optical component, a compressive clamp for gripping the birefringent optical component about a circumference so as to exert a compressive force on said birefringent optical component at least approximately perpendicular to the optical axis, said clamp comprising an annular pressure chamber surrounding the birefringent optical component and being compressed by at least one actuator to hold the birefringent optical component and cause elastic deformation of the birefringent optical component and thereby change the thickness of the birefringent optical component.

9. The assembly as claimed in claim 8, wherein said annular pressure chamber is provided with a pressure connection which is connected to an external pressure source.

10. An assembly for changing the stress-induced birefringence and the thickness of a birefringent optical component by elastic deformation caused by means of stress, comprising a birefringent optical component, at least one compressive clamp wherein the birefringent optical component is gripped on a circumference, so as to exert a compressive force on said birefringent optical component at least approximately perpendicular to the optical axis, said at least one compressive clamp comprising an annular pressure chamber surrounding the birefringent optical component and being actuated by at least one actuator to thereby change the birefringence and the thickness of the birefringent optical component.

11. The assembly as claimed in claim 10, wherein said annular pressure chamber is provided with a pressure connection which is connected to an external pressure source.

* * * * *

UNITED STATES PATENT AND TRADEMARK OFFICE
CERTIFICATE OF CORRECTION

PATENT NO. : 6,937,394 B2
DATED : August 30, 2005
INVENTOR(S) : Rainer Labus

Page 1 of 1

It is certified that error appears in the above-identified patent and that said Letters Patent is hereby corrected as shown below:

Column 2,
Line 33, "… optical component However, …." should be -- … optical component. However, …. --.

Column 5,
Line 4, "…. clamping ring 21 …" should be -- …. clamping ring 2$^1$ … --.

Signed and Sealed this

Thirteenth Day of June, 2006

JON W. DUDAS
*Director of the United States Patent and Trademark Office*